United States Patent
Ishikawa

(10) Patent No.: US 10,076,043 B2
(45) Date of Patent: Sep. 11, 2018

(54) WIRING BOARD SOLDERED WITH LEAD WIRE AND ELECTRONIC DEVICE COMPRISING WIRING BOARD

(71) Applicant: CANON KABUSHIKI KAISHA, Tokyo (JP)

(72) Inventor: Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/358,948

(22) Filed: Nov. 22, 2016

(65) Prior Publication Data

US 2017/0156213 A1    Jun. 1, 2017

(30) Foreign Application Priority Data

Nov. 30, 2015 (JP) ................. 2015-233197

(51) Int. Cl.
*H05K 1/11* (2006.01)
*H05K 1/18* (2006.01)
*H05K 3/34* (2006.01)
*H01R 11/11* (2006.01)
*H01R 4/02* (2006.01)

(52) U.S. Cl.
CPC .......... *H05K 3/3421* (2013.01); *H01R 11/11* (2013.01); *H05K 1/111* (2013.01); *H05K 1/18* (2013.01); *H01R 4/023* (2013.01); *H05K 2201/09381* (2013.01); *H05K 2201/09745* (2013.01); *H05K 2201/10287* (2013.01); *Y02P 70/613* (2015.11)

(58) Field of Classification Search
CPC . H05K 1/18; H05K 1/111; H05K 3/34; H05K 2203/049; H05K 2201/09381; H05K 2201/10287
See application file for complete search history.

(56) References Cited

U.S. PATENT DOCUMENTS 5,372,427 A * 12/1994 Padovani ................. G01K 1/16 338/22 R
2012/0214359 A1* 8/2012 Yamada ................. H05K 1/111 439/874

FOREIGN PATENT DOCUMENTS

| JP | 08279111 A | * 10/1996 |
| JP | 410341126 A | * 12/1998 |
| JP | 2007251077 A | * 2/2006 |
| JP | 2014-135392 A | 7/2014 |

* cited by examiner

*Primary Examiner* — Ishwarbhai B Patel
(74) *Attorney, Agent, or Firm* — Fitzpatrick, Cella, Harper & Scinto

(57) ABSTRACT

A wiring board and an electronic device which suppress variation in a leading direction of lead wire after soldering and variation in a tip position of the lead wire and keep a height of a soldered lead wire low while suppressing variation in the height. A wiring board is soldered with lead wire. A surface of the wiring board is formed with a land part by exposing a conductor. The land part is formed with a groove part, which is a region not including the conductor, for positioning of the lead wire along a leading direction. The lead wire mounted to the groove part is soldered to the land part in such a manner as to cover the groove part.

5 Claims, 5 Drawing Sheets

WIRING BOARD SOLDERED WITH LEAD WIRE AND ELECTRONIC DEVICE COMPRISING WIRING BOARD

BACKGROUND OF THE INVENTION

Field of the Invention

The present invention relates to a wiring board soldered with lead wire and an electronic device comprising the wiring board.

Description of the Related Art

In recent years, electronic devices have been downsized and becoming thinner. In a device where incorporated components are highly densified, a space for extending lead wire is limited with less flexibility. In such circumstances, it is desirable to suppress variation in a leading direction of the lead wire or variation in tip position in the leading direction when the lead wire is soldered to a soldering land included in a printed wiring board for connection thereto. Therefore, it is desirable to perform soldering by positioning the lead wire in and at an appropriate direction and a position in the land.

Therefore, technique to mount lead wire at an appropriate position on a land is disclosed in Japanese Laid-Open Patent Publication (Kokai) No. 2014-135392. In Japanese Laid-Open Patent Publication (Kokai) No. 2014-135392, a leading direction of lead wire is positioned by providing a solder ball in advance, on a land of a printed wiring board, adjacent to an area for mounting the lead wire.

In the related art disclosed in Japanese Laid-Open Patent Publication (Kokai) No. 2014-135392, however, a dedicated special device is required for forming the solder ball on the soldering land. Therefore, there is a problem that implementation is difficult in a general step of manufacturing a printed wiring board mounted with components.

Furthermore, for determination of a direction of the lead wire, generally, the shape of a land is formed to be a rectangular or an ellipse such that a direction where the lead wire is desired to be led corresponds to a longitudinal direction thereof. The lead wire is soldered according to the shape. In operation of soldering, however, a position or direction of the lead wire varies in the land. In this case, it is difficult to appropriately extend the lead wire in a limited space in a device.

Moreover, generally employed is a method to provide cream solder to a soldering land in advance in a printing step of cream solder before reflow mounting of mounting components onto the printed wiring board and to allow formation of preliminary solder after completion of the reflow mounting. Forming the preliminary solder can enhance working property of soldering. However, since soldering is performed by heating up and melting solder while lead wire is placed on the preliminary solder, the degree of floating of the lead wire from a substrate after soldering is not constant due to variation in the work and thus the height varies. In order to downsize devices and implement thinner devices, it is desirable to keep the height of the lead wire from the substrate as low as possible and constant after soldering.

SUMMARY OF THE INVENTION

The present invention provides a wiring board and an electronic device which suppress variation in a leading direction of lead wire after soldering and variation in a tip position of the lead wire and keep a height of a soldered lead wire low while suppressing variation in the height.

Accordingly, the present invention provides an electronic device comprising lead wire, and a wiring board soldered with said lead wire, wherein a surface of said wiring board is formed with a land part by exposing a conductor, wherein the land part is formed with a groove part, which is a region not including the conductor, for positioning of said lead wire along a leading direction, and wherein said lead wire mounted to the groove part is soldered to the land part in such a manner as to cover the groove part.

The present invention allows for suppressing variation in the leading direction of the lead wire after soldering and variation in the tip position of the lead wire and keeping the height of the soldered lead wire low while suppressing variation in the height.

Further features of the present invention will become apparent from the following description of exemplary embodiments (with reference to the attached drawings).

DESCRIPTION OF THE EMBODIMENTS

Hereinafter, embodiments of the present invention will be described with reference to the drawings.

Figure 1A:
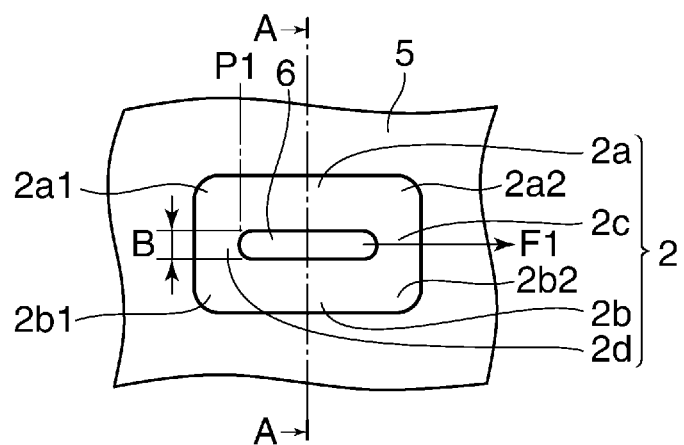
FIG. 1A is a partial plan view of a printed wiring board before soldering of lead wire.
Figure 1B:
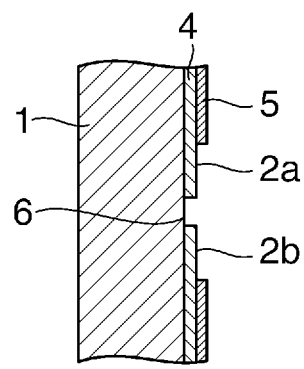
FIG. 1B is a cross-sectional view taken along a line A-A in FIG. 1A.

FIG. 1A is a partial plan view of a printed wiring board before soldering of lead wire in an electronic device according to a first embodiment of the present invention. FIG. 1A is illustrated with a focus on one soldering land on the printed wiring board. FIG. 1B is a cross-sectional view taken along a line A-A in FIG. 1A.

On a surface of a printed wiring board 1, copper foil 4 as a conductor is formed and resist 5 is covering the copper foil 4. A soldering land 2 (land part) is formed by opening the resist 5 covering the copper foil 4 and thereby exposing the copper foil 4 therefrom. A leading direction F1 is a target leading direction of lead wire 3 (FIG. 2F) after soldering. The shape of the land 2 is substantially rectangular. A longitudinal direction of the land 2 substantially corresponds with the leading direction F1 (FIG. 2D) of the lead wire 3 to be soldered (including perfect matching). The land 2 includes a slit part 6 of a linear shape formed not include the copper foil 4. The slit part 6 is a region in the land 2 without the copper foil 4. A longitudinal direction of the slit part 6 is in the same direction as the longitudinal direction of the land 2. Thus, the slit part 6 is formed along the leading direction F1.

The land 2 includes a first region 2a, a second region 2b, a first bridging part 2c, and a second bridging part 2d. The land 2 overall has a ring shape. Specifically, the land 2 is divided by the slit part 6 into two regions. The first region 2a and the second region 2b are opposite to each other while interposing the slit part 6 therebetween. End parts of the regions 2a and 2b on a leading side (right side in FIG. 1A) of the lead wire 3, that is, an end part 2a2 of the first region 2a and an end part 2b2 of the second region 2b are connected by the first bridging part 2c. Furthermore, an end part 2a1 of the first region 2a and an end part 2b1 of the second region 2b on the opposite side of the leading side of the lead wire 3 (left side in FIG. 1A) are connected by the second bridging part 2d. An end position P1 of the slit part 6 on the opposite side of the leading side of the lead wire 3 is defined by the second bridging part 2d. A width B of the slit part 6 is smaller than a diameter D (FIG. 2D) of an inner conductor 9 of the lead wire 3.

Figure 2A:
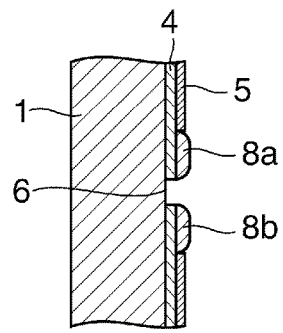
FIGS. 2A to 2F are diagrams for explaining steps of soldering lead wire to a land.

With FIGS. 2A to 2F, steps of soldering the lead wire 3 to the land 2 will be described. FIGS. 2A, 2C, and 2E correspond to FIG. 1B while FIGS. 2B, 2D, and 2F correspond to FIG. 1A.

Figure 2B:
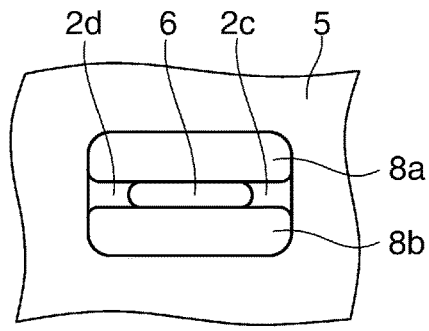
Figure 2C:
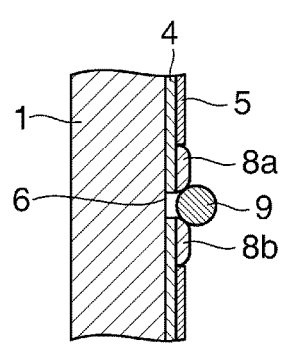

As illustrated in FIGS. 2A and 2B, a worker (not illustrated) provides preliminary solder 8 (8a and 8b) on the first region 2a and the second region 2b of the land 2 in the following manner. First, in a printing step of cream solder for mounting electronic components (not illustrated) to be mounted on the printed wiring board 1, the cream solder is printed on the two regions 2a and 2b. Thereafter, when the electronic components are mounted on the printed wiring board 1 and subjected to reflow mounting, the printed cream solder melts and then is cooled and coagulates to be in a state as illustrated in FIGS. 2A and 2B. That is, the preliminary solder 8a is provided on the first region 2a and the preliminary solder 8b is provided on the second region 2b.

Figure 2D:
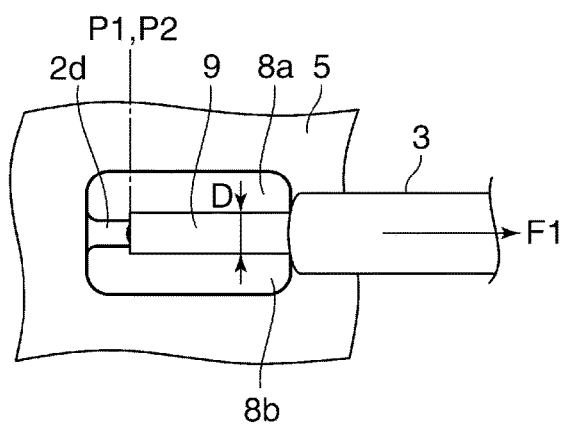
Figure 2E:
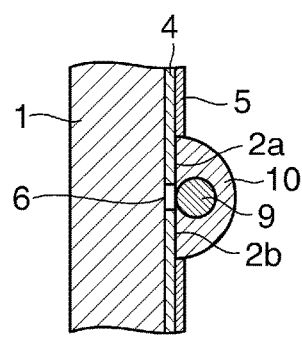

Next, as illustrated in FIGS. 2C and 2D, the worker places the lead wire 3 on the land 2. The lead wire 3 is removed of covering of a tip thereof and the inner conductor 9 is exposed. The exposed inner conductor 9 includes a plurality of core wires twisted and processed by soldering. The inner conductor 9 is placed along a valley part formed by the slit part 6 in the land 2 and the preliminary solder 8a and 8b. Also, the inner conductor 9 is placed such that a tip position P2 of the inner conductor 9 corresponds with the end position P1 of the slit part 6. Since a position of the inner conductor 9 is limited by the valley part to some extent, it is easy to cause a leading direction of the lead wire 3 to correspond with the target leading direction F1. Moreover, since the end position P1 serves as a clear guide, it is easy to cause the tip position P2 to correspond with the end position P1. Therefore, orientation of the lead wire 3 and a position of the lead wire 3 in a longitudinal direction thereof can be easily determined.

Figure 2F:
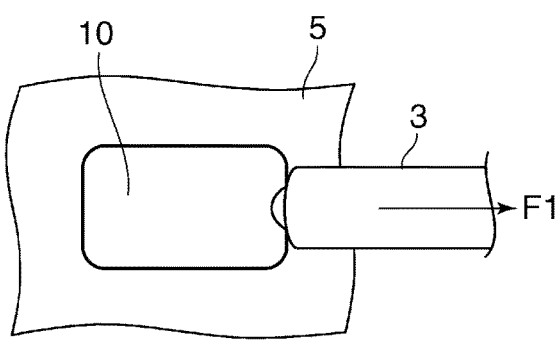

Next, the worker heats up and melts the preliminary solder 8 with a soldering iron and solders the inner conductor 9 of the lead wire 3 to the land 2 while supplying additive solder thereto. In this manner, as illustrated in FIGS. 2E and 2F, the inner conductor 9 is soldered by solder 10 where the preliminary solder 8 and the additive solder are integrated.

Here, since the width B of the slit part 6 of the land 2 is formed to be smaller than the diameter D of the inner conductor 9, the inner conductor 9 is soldered to each of the first region 2a and the second region 2b. This allows for obtaining a preferable soldering state as well as reliable soldering strength. Furthermore, since the inner conductor 9 is placed along the slit part 6, the solder 10 does not enter between the inner conductor 9 and the printed wiring board 1, thereby avoiding the lead wire 3 from floating after soldering. This allows for keeping the height of the lead wire 3 after soldering low as well as suppressing variation in the height. Furthermore, the land 2 includes the first bridging part 2c on the leading side and thus the inner conductor 9 is soldered also to the first bridging part 2c. This allows for securing a firm soldering state where solder is unlikely to be peeled off even though the slit part 6 is included since a root part of the inner conductor 9 overlaps with the first bridging part 2c and thereby soldered, thus resulting in strength when the lead wire 3 is pulled after soldering.

According to the present embodiment, the slit part 6 without the copper foil 4 is formed in the soldering land 2 along the target leading direction F1 of the lead wire 3 to be soldered. This allows for suppressing variation in the leading direction of the lead wire 3 after soldering and variation in the tip position P2 of the lead wire 3 and keeping the height of the soldered lead wire 3 low while suppressing variation in the height.

Especially, the width B of the slit part 6 is smaller than the diameter D of the inner conductor 9 and thus preferable soldering can be performed. Furthermore, the land 2 includes the first bridging part 2c overlapping with the inner conductor 9 and thus a part, on the leading side, of the inner conductor 9 is unlikely to be peeled off. Moreover, the preliminary solder 8a and 8b is provided to the first region 2a and the second region 2b upon soldering and thus it is further easier to cause the leading direction of the lead wire 3 to correspond with the target leading direction F1. Moreover, soldering work described in the present embodiment does not require a dedicated special device and is easily implemented by general steps of manufacturing a printed wiring board mounted with components.

In the first embodiment, the example of leading the lead wire in a direction parallel to the longitudinal direction of the soldering land has been described. On the contrary to this, in a second embodiment of the present invention, an example of setting a leading direction of lead wire in a direction different from a longitudinal direction of a soldering land will be described.

Figure 3:
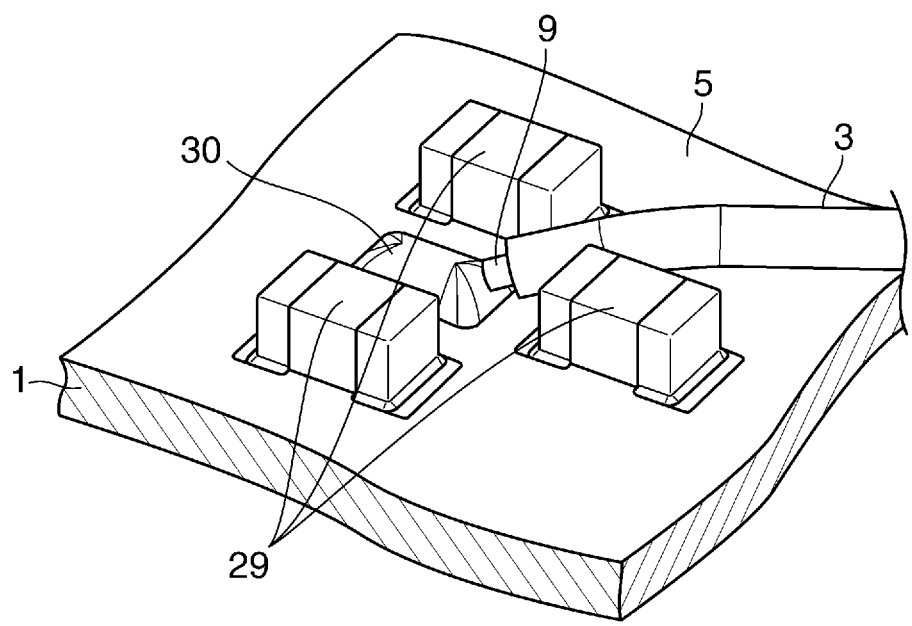
FIG. 3 is a partial perspective view of a printed wiring board after soldering of lead wire.

FIG. 3 is a partial perspective view of a printed wiring board 1 after soldering of lead wire 3 in an electronic device according to the second embodiment. In FIG. 3, illustration of copper foil 4 is omitted. The printed wiring board 1 is mounted with a plurality of electronic components 29. The inner conductor 9 of the lead wire 3 is subjected to a soldering step and thereby soldered by solder 30. Since three electronic components 29 are disposed around a soldered part of the inner conductor 9, due to this constraint, it is desirable to lead the lead wire 3 to a direction not interfering with the electronic components 29.

Figure 4A:
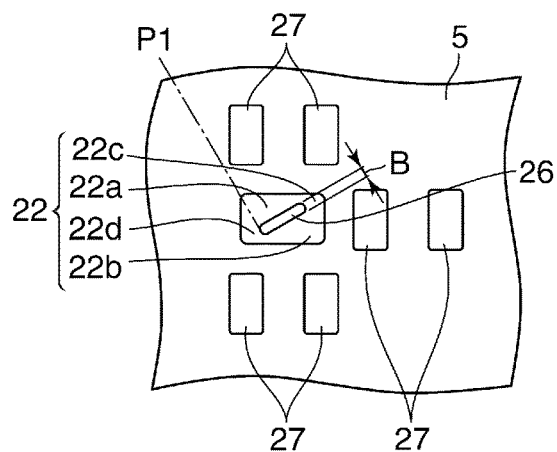
FIGS. 4A to 4D are diagrams for explaining steps of soldering lead wire to a land.

With FIGS. 4A to 4D, steps of soldering the lead wire 3 to the land 2 will be described. FIG. 4A is a partial plan view of the printed wiring board 1 before soldering of the lead wire 3 with a focus on one soldering land.

As illustrated in FIG. 4A, on the printed wiring board 1, a component mounting land 27 where the electronic component 29 is disposed and a soldering land 22 to be soldered with the lead wire 3 are formed. Since it is desired to secure a space for work with a soldering iron after mounting the components, it is desirable to form the soldering land 22 at a predetermined distance or more from the electronic component 29. Due to this, in a narrow space surrounded by the electronic components 29, the soldering land 22 is usually provided such that a longitudinal direction thereof corresponds with a longitudinal direction of the electronic component 29. This similarly applies to the present embodiment.

In the land 22, a slit part 26 corresponding to the soldering land 2 of the first embodiment is provided. The slit part 26 is formed along a leading direction F1 (FIG. 4C). Here, since it is desirable to lead the lead wire 3 in a direction avoiding the electronic component 29, the slit part 26 is formed while a predetermined angle is provided relative to the longitudinal direction of the land 22. Therefore, the longitudinal direction of the slit part 26 is not parallel to the longitudinal direction of the land 22.

The land 22 includes a first region 22a, a second region 22b, a first bridging part 22c, and a second bridging part 22d. Specifically, the land 22 is divided by the slit part 26 into two regions. The first region 22a and the second region 22b are opposite to each other while interposing the slit part 26 therebetween. An end part of the first region 22a and an end part of the second region 22b on a leading side of the lead wire 3 (upper right side in FIG. 4A) are connected by the first bridging part 22c. Furthermore, an end part of the first region 22a and an end part of the second region 22b on the opposite side of the leading side of the lead wire 3 (lower left side in FIG. 4A) are connected by the second bridging part 22d. An end position P1 of the slit part 26 on the opposite side of the leading side of the lead wire 3 is defined by the second bridging part 22d. A width B of the slit part 26 is smaller than a diameter D (FIG. 4C) of an inner conductor 9 of the lead wire 3.

Figure 4B:
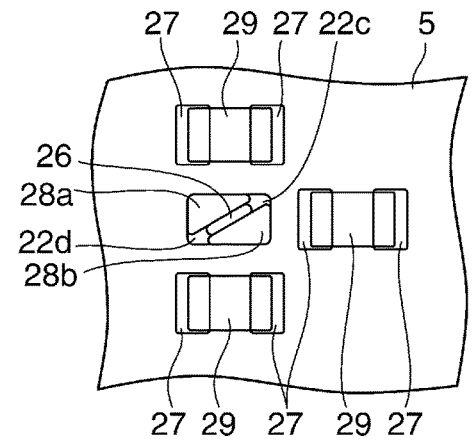
Figure 4C:
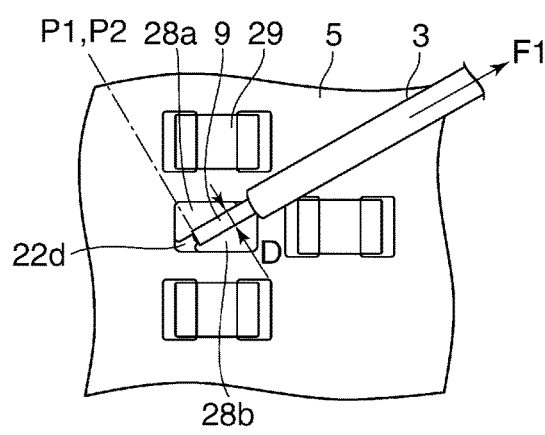

As illustrated in FIG. 4B, a worker (not illustrated) provides preliminary solder 28 (28a and 28b) on the first region 22a and the second region 22b of the land 22 upon disposing and mounting the electronic component 29 on the component mounting land 27 in a similar manner as described in FIGS. 2B and 2C. That is, the preliminary solder 28a is provided on the first region 22a and the preliminary solder 28b is provided on the second region 22b. Next, as illustrated in FIG. 4C, the worker places the lead wire 3 on the land 22. Similarly to the descriptions of FIGS. 2C and 2D, the inner conductor 9 is placed along a valley part formed by the slit part 26 in the land 22 and the preliminary solder 28a and 28b. Also, the inner conductor 9 is placed such that a tip position P2 thereof corresponds with the end position P1 of the slit part 26.

Figure 4D:
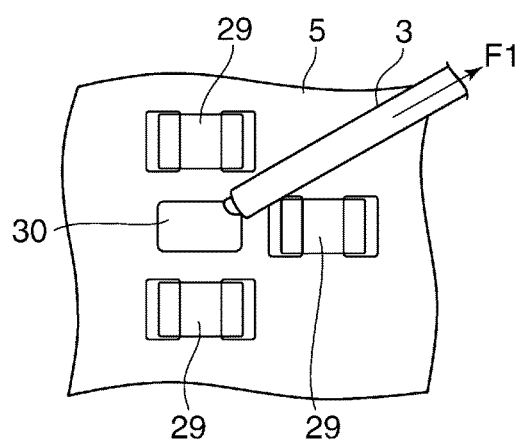

Next, similarly to the descriptions of FIGS. 2E and 2F, the worker heats up and melts the preliminary solder 28 with a soldering iron and solders the inner conductor 9 of the lead wire 3 to the land 22 while supplying additive solder thereto. In this manner, as illustrated in FIGS. 3 and 4D, the inner conductor 9 is soldered by solder 30 where the preliminary solder 28 and the additive solder are integrated.

The present embodiment allows for achieving similar effects to those of the first embodiment with regard to suppressing variation in the leading direction of the lead wire 3 after soldering and variation in the tip position P2 and keeping the height of the lead wire 3 low while suppressing variation in the height.

Also, even when the longitudinal direction of the land 22 and the leading direction F1 are different due to constraints by the electronic component 29 disposed around the land 22, aligning a direction of forming the slit part 26 to the leading direction F1 allows for leading the lead wire 3 into a desired direction.

With FIGS. 5A to 5E, variations of the first and the second embodiments will be described.

Figure 5A:
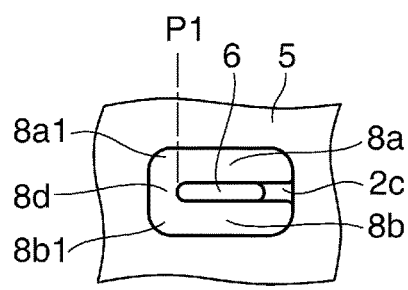
FIGS. 5A to 5E are diagrams illustrating variations of a first and a second embodiments.
Figure 5B:
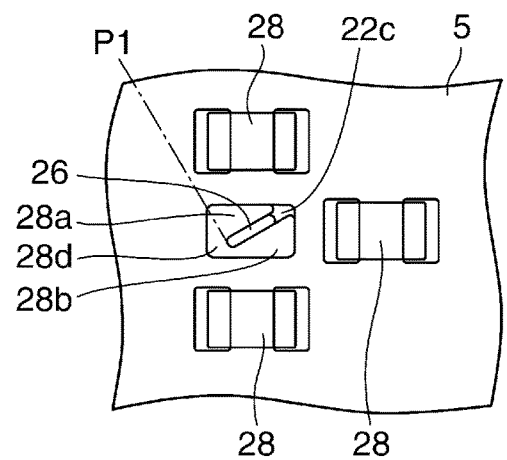
Figure 5C:
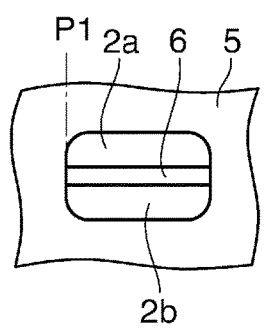
Figure 5D:
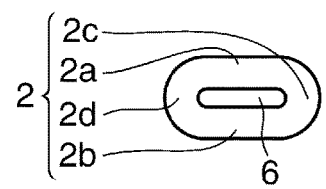
Figure 5E:
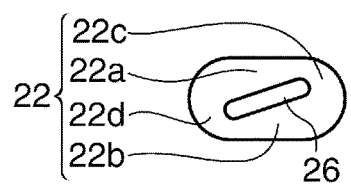

FIG. 5A is a diagram illustrating variations of the first embodiment. In the first embodiment, before soldering of the lead wire 3, the preliminary solder 8a and 8b is in a separated state with the preliminary solder 8a provided on the first region 2a and the preliminary solder 8b provided on the second region 2b. As illustrated in FIG. 5A, however, the preliminary solder 8 may be overall formed into a U-letter shape by connecting, by a third bridging part 8d, respective end parts 8a1 and 8b1 of the preliminary solder 8a and 8b on the opposite side of the leading side of the lead wire 3. This clarifies an end position P1 of the slit part 6, allowing for easy positioning of a tip of the lead wire 3. For example, abutting the tip of the lead wire 3 against the third bridging part 8d allows for easy positioning. This variation can also be applied to the second embodiment. As illustrated in FIG. 5B, for example, respective end parts of the preliminary solder 28a and 28b on the opposite side of the leading side of the lead wire 3 may be connected by a third bridging part 28d.

Meanwhile in the first embodiment, the slit part 6 is shorter than the entire length of the land 2 in the longitudinal direction (FIG. 1A). From the perspective of simplifying the configuration, however, as in a variation illustrated in FIG. 5C, a slit part 6 may be formed over the entire length of a land 2. In this case, an end position P1 of the slit part 6 is defined by a boundary between the land 2 and resist 5. Incidentally, the slit part 6 may be formed over an area where the land 2 is formed on one side or both sides of the land 2 in the longitudinal direction. That is, at least one of the first bridging part 2c and the second bridging part 2d may not be included. Such a variation can also be applied to the second embodiment.

Incidentally, in the first and the second embodiments, the lands 2 and 22 are substantially rectangular but the shape thereof is not limited thereto. When the land 2 or 22 has a shape where the longitudinal direction and the lateral direction are recognizable, as in the variations illustrated in FIGS. 5D and 5E, the land 2 or 22 may have an elliptical shape (extended circle or ellipse).

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2015-233197, filed Nov. 30, 2015 which is hereby incorporated by reference herein in its entirety.

What is claimed is:

1. An electronic device, comprising:
   a lead wire; and
   a wiring board that includes a conductor and a resist layer covering the conductor,
   wherein a portion of the wiring board is a land part which is not covered by the resist layer, the land part includes:
      a groove part that does not include the conductor and is for positioning of the lead wire along a leading direction,
      a first connecting part of the conductor disposed on a leading side of the lead wire in line with the groove part,
      a second connecting part of the conductor disposed on an opposite side of the leading side of the lead wire in line with the groove part,
      first end parts of the conductor disposed on the leading side of the lead wire, wherein the first ends parts are respectively disposed on opposite sides of the first connecting part and are connected by the first connecting part, and
      second end parts of the conductor disposed on the opposite side of the leading side of the lead wire, wherein the second end parts are respectively disposed on opposite sides of the second connecting part and are connected by the second connecting part,
   wherein the lead wire is mounted to the groove part and soldered to the land part in such a manner as to cover the groove part, and
   wherein said lead wire is soldered to the first connecting part.

2. The electronic device according to claim 1,
   wherein a longitudinal direction of the groove part and a longitudinal direction of the land part are different.

3. The electronic device according to claim 1,
   wherein a width of the groove part is smaller than a diameter of a part of the lead wire to be soldered.

4. The electronic device according to claim 1,
   wherein the lead wire is soldered to regions of the conductor opposite to each other interposing the groove part.

5. A wiring board to which a lead wire is soldered, comprising:
   a conductor; and
   a resist layer covering the conductor, wherein the wiring board includes a land part which is not covered by the resist layer,
   wherein the land part includes:
      a groove part that does not include the conductor and is for positioning of the lead wire along a leading direction,
      a first connecting part of the conductor disposed on a leading side of the lead wire in line with the groove part,
      a second connecting part of the conductor disposed on an opposite side of the leading side of the lead wire in line with the groove part,
      first end parts of the conductor disposed on the leading side of the lead wire, wherein the first ends parts are respectively disposed on opposite sides of the first connecting part and are connected by the first connecting part, and
      second end parts of the conductor disposed on the opposite side of the leading side of the lead wire, wherein the second end parts are respectively disposed on opposite sides of the second connecting part and are connected by the second connecting part,
   wherein the lead wire is mounted to the groove part and soldered to the land part in such a manner as to cover the groove part, and
   wherein the lead wire is soldered to the first connecting part.

* * * * *